(12) United States Patent
Yang

(10) Patent No.: US 7,299,387 B2
(45) Date of Patent: Nov. 20, 2007

(54) ADDRESS GENERATOR FOR BLOCK INTERLEAVING

(75) Inventor: Ping-Chung Yang, Jiji Township, Nantou County (TW)

(73) Assignee: Benq Corporation, Taoyuan (TW)

( * ) Notice: Subject to any disclaimer, the term of this patent is extended or adjusted under 35 U.S.C. 154(b) by 618 days.

(21) Appl. No.: 10/971,619

(22) Filed: Oct. 21, 2004

(65) Prior Publication Data

US 2005/0102599 A1    May 12, 2005

(30) Foreign Application Priority Data

Nov. 11, 2003    (TW) .............................. 92131507 A

(51) Int. Cl.
*G11C 29/18*    (2006.01)
*G11C 29/40*    (2006.01)
(52) U.S. Cl. ...................................... 714/702; 714/701
(58) Field of Classification Search ...................... None
See application file for complete search history.

(56) References Cited

U.S. PATENT DOCUMENTS 6,691,261 B1 *   2/2004   Ovalekar .................... 714/701
6,748,561 B2 *   6/2004   Prasad ........................ 714/702
6,986,081 B1 *   1/2006   Furutani ..................... 714/701

FOREIGN PATENT DOCUMENTS

JP            01293074 A   *  11/1989

OTHER PUBLICATIONS

Mathew et al., Algorithmic Foundations for a Parallel Vector Access Memory System, Jul. 2000, Proceedings of the twelfth annual ACM symposium on Parallel algorithms and architectures SPAA'00, ACM Press, pp. 156-165.*

* cited by examiner

*Primary Examiner*—Cynthia Britt
*Assistant Examiner*—Dipakkumar Gandhi
(74) *Attorney, Agent, or Firm*—Thomas, Kayden, Horstemeyer & Risley

(57) ABSTRACT

A block interleaving/de-interleaving method and address generator thereof. The block interleaver segments the coded symbols into blocks according to a predetermined column value (C). The interleaver reads the coded symbols of each block by jumping according to the corresponding values $(T_0:T_{C-1})$ of a sequence matching table and the column value, and writes the values in sequence. The block de-interleaver reads the coded symbols sequentially, and re-assembles the coded symbols in the original order according to the same column value (C) and sequence matching table as the interleaver.

18 Claims, 4 Drawing Sheets

| Address | Step A | Step B | Step C | Step D |
|---|---|---|---|---|
| 0 | - | 0 | 0 | 0 |
| 1 | - | 4 | 4 | 4 |
| 2 | - | 8 | 8 | 8 |
| 3 | - | 12 | 12 | 12 |
| 4 | - | 16 | 16 | 16 |
| 5 | - | 20 | 20 | 20 |
| 6 | - | 24 | 24 | 24 |
| 7 | - | - | 2 | 2 |
| 8 | - | - | 6 | 6 |
| 9 | - | - | 10 | 10 |
| 10 | - | - | 14 | 14 |
| 11 | -- | - | 18 | 18 |
| 12 | - | - | 22 | 22 |
| 13 | - | - | 1 | 1 |
| 14 | - | - | 5 | 5 |
| 15 | - | - | 9 | 9 |
| 16 | - | - | 13 | 13 |
| 17 | - | - | 17 | 17 |
| 18 | - | - | 21 | 21 |
| 19 | - | - | 25 | 25 |
| 20 | 0 | - | - | 3 |
| 21 | 1 | 1 | - | 7 |
| 22 | 2 | 2 | - | 11 |
| 23 | 3 | 3 | 3 | 15 |
| 24 | 4 | - | - | 19 |
| 25 | 5 | 5 | - | 23 |
| 26 | 6 | 6 | - | - |
| 27 | 7 | 7 | 7 | - |
| 28 | 8 | 8 | - | - |
| 29 | 9 | 9 | - | - |
| 30 | 10 | 10 | - | - |
| 31 | 11 | 11 | 11 | - |
| 32 | 12 | - | - | - |
| 33 | 13 | 13 | - | - |
| 34 | 14 | 14 | - | - |
| 35 | 15 | 15 | 15 | - |
| 36 | 16 | - | - | - |
| 37 | 17 | 17 | - | - |
| 38 | 18 | 18 | - | - |
| 39 | 19 | 19 | 19 | - |
| 40 | 20 | - | - | - |
| 41 | 21 | 21 | - | - |
| 42 | 22 | 22 | - | - |
| 43 | 23 | 23 | 23 | - |
| 44 | 24 | - | - | - |
| 45 | 25- | 25 | - | - |

FIG. 2

ADDRESS GENERATOR FOR BLOCK INTERLEAVING

BACKGROUND

The present invention relates to an interleaving and de-interleaving method of a communication system, and more specifically, to a block interleaving and de-interleaving method and address generator thereof.

The main function of channel coding is to detect and correct errors induced by random noise occurring in transmission in the wireless communication system. Transmission errors happen randomly and are thus usually distributed evenly in the data. Burst error, however sometimes occurs during transmission, and is likely to exceed the error detection or error correction abilities of the encoder/decoder, requiring retransmission if the errors cannot be corrected. Interleaving is a method of improving burst error correction ability. The interleaving process re-orders data (i.e. the coded symbols) before transmission. When a burst error occurs during transmission, errors are dispersed by performing the corresponding de-interleaving process. The encoder is able to improve the error correction ability by reducing the likelihood of long consecutive errors. The address generator for interleaving, or the interleaver, is an apparatus that changes the order of the coded symbols in the transmitter, whereas the address generator for de-interleaving, or the de-interleaver, is a corresponding apparatus assembling the coded symbols into their original order.

Block interleaving is one of the most common and easily performed interleaving methods. The block interleaving method permutes the coded symbols in blocks from the encoder, and rearranges the coded symbols. Permutation is normally performed by filling a matrix with coded sequences by row, then outputting to the modulator by column. As shown in FIGS. 1A and 1B, block interleaving is explained using a matrix with C columns and R rows. FIG. 1A shows the filling order of the matrix at the transmitter, wherein the coded symbols {0, 1, 2, 3, 4, 5, . . . , M-3,M-2,M-1} are filled into the matrix by row. The total number of coded symbols (M) is 26, and the column value (C) is 4 in this example. The row value (R) is thus 6, the whole number obtained from dividing 26 by 4, and the remainder (W) is 2. As shown in FIG. 1A, there are R complete rows and an incomplete row, which is the $(R+1)^{st}$ row with only W coded symbols. As shown in FIG. 1B, the sequence of columns is then permuted before input to the modulator. In this example, the block interleaver swaps the second and the third columns. The interleaving operation is accomplished by outputting the coded symbols {0, 4, 8, . . . , 2, 6, 10, . . . 1, 5, 9, . . . 3, 7, 11, . . . } from the matrix by column. At the receiver, the de-interleaver performs the inverse operation.

In a typical case, both the interleaver and de-interleaver read the coded symbols from the memory cells, and then write the coded symbols after performing interleaving or de-interleaving into other memory cells. This kind of interleaving or de-interleaving operation requires accessing the memory twice for each coded symbol. Since the M coded symbols must be filled before they can be read out, twice as many memory cells as coded symbols (2M) are required. Furthermore, since the interleaver writes the coded symbols by row and reads the coded symbols by column, a complete column can only be obtained for input to the modulator when the first coded symbol of the last row is filled in the matrix. In other words, C(R−1)+1 memory cells must be filled before the interleaver begins input of the coded symbols to the modulator. A minimum delay time is therefore the time required to access the memory C(R−1)+1 times.

SUMMARY

An interleaving/de-interleaving method that computes some of the initial output addresses while reading the coded symbols, to ensure that the block interleaving/de-interleaving is accomplished with the shortest delay is provided. The interleaver of the present invention reads a coded symbol once and immediately computes the address for output without waiting until the coded symbols in the last row of the matrix have been read. At the transmitter, the interleaver reads the coded symbols by jumping, and writes the initial output addresses in order. The interleaving operations which fill and are read out from the matrix are replaced with jumping input access. The jumping operation is computed according to the provided algorithm. At the receiver, the de-interleaver performs the inverse operation of reading the coded symbols in order, but writes the initial output addresses by jumping. The de-interleaving operation for filling and reading out from the matrix is replaced with a jumping output sequence. As a result, the block interleaving/de-interleaving method requires only one read/write operation per coded symbol, eliminating the (R−1)+1 delay caused by accessing memory. The memory cells for storing the input coded symbols can be overlap with the memory cells for storing the output coded symbols. Furthermore, the interleaving and de-interleaving method is easily implemented, and the provided address generator can perform both interleaving and de-interleaving.

An embodiment of the block interleaving method performs interleaving for M coded symbols in a memory with two blocks, one for reading and another for writing. The write memory block has memory cells starting with an initial output address, and the read memory block has memory cells starting with an initial input address. The first coded symbol is stored in the initial input address, and the remaining coded symbols are stored successively in the memory cells after the initial input address. Both ends, performing interleaving and de-interleaving agree on a column value C for segmenting the M coded symbols, and a sequence matching table $[T_0, T_1, \ldots, T_{C-1}]$ comprising C corresponding values for appointing the permutation sequence. Each of the corresponding values in the sequence matching table is treated as a reference value successively, and the coded symbols in the read memory block are read out from the reference value with a fixed spacing C. For example, if the current reference value is $T_1$, the coded symbols $\{T_1, T_1+C, T_1+2C, \ldots\}$ are read out. The coded symbols are then written to the memory cells of the write memory block starting from the initial output address according to the read order. The above reading and writing processes are repeated until all the corresponding values $[T_0, T_1, \ldots, T_{C-1}]$ have been selected as the reference value.

The column value C is used to segment the M coded symbols into R blocks with W coded symbols as remainder, wherein each block includes C coded symbols and a $(R+1)^{st}$ block includes W coded symbols. Normally only R corresponding coded symbols are read out according to each reference value, however if the reference value is less than the remainder W, an extra corresponding coded symbol in the $(R+1)^{st}$ block is also read out.

An embodiment of the block de-interleaving method performs de-interleaving for M coded symbols in a memory with two blocks, one for reading and another for writing.

The write memory block has memory cells starting with an initial output address, and the read memory block has memory cells starting with an initial input address. The first coded symbol is stored in the initial input address, and the rest of the coded symbols are stored successively in the memory cells after the initial input address. The column value C and the sequence matching table are the same as on the side performing the interleaving operation. The M coded symbols are read out from the read memory block sequentially, and segmented into C blocks, and each block corresponding to each corresponding value of the sequence matching table $[T_0, T_1, \ldots, T_{C-1}]$. The value corresponding to each block is selected as a reference value sequentially, and from the reference value, the coded symbols to be read are chosen by jumping according to the sequence matching table.

The de-interleaving method also comprises comparing the value corresponding to each block with the remainder (W) to determine the number of coded symbols in the block. If the corresponding value of the block is less than the remainder (W), the block has R+1 coded symbols, otherwise the block has R coded symbols. Both interleaving and de-interleaving methods allow the read memory block to overlap up to R memory cells with the write memory block.

An address generator to perform interleaving and de-interleaving on M coded symbols is also provided. The address generator comprises an input block, a memory overlap block, a computing block, and an output block. The input block receives input parameters such as initial input address, total number of coded symbols (M), column number (C), clock signal, and reset signal. The memory overlap block coupled to the input block computes an initial output address according to the initial input addresses, M, and C. The computing block coupled to the input block and the memory overlap block computes read and write addresses for each of the M coded symbols. The output block coupled to the computing block outputs a read address array and a write address array. The computing block computes an input address index and an output address index for each of the M coded symbols in two loops, combining the initial input address, the initial output address, and a sequence matching table to obtain the read and write addresses for each of the M coded symbols.

DESCRIPTION OF THE DRAWINGS

The invention can be more fully understood by reading the subsequent detailed description in conjunction with the examples and references made to the accompanying drawings, wherein:

FIG. 1A illustrates an example of coded symbols arranged in a matrix before performance of the block interleaving operation.

FIG. 1B illustrates an example of coded symbols arranged in a matrix after performance of the block interleaving operation.

FIG. 2 illustrates an example of reading and writing the coded symbols according to an embodiment of the interleaving method.

DETAILED DESCRIPTION

Figures 1A, 1B:
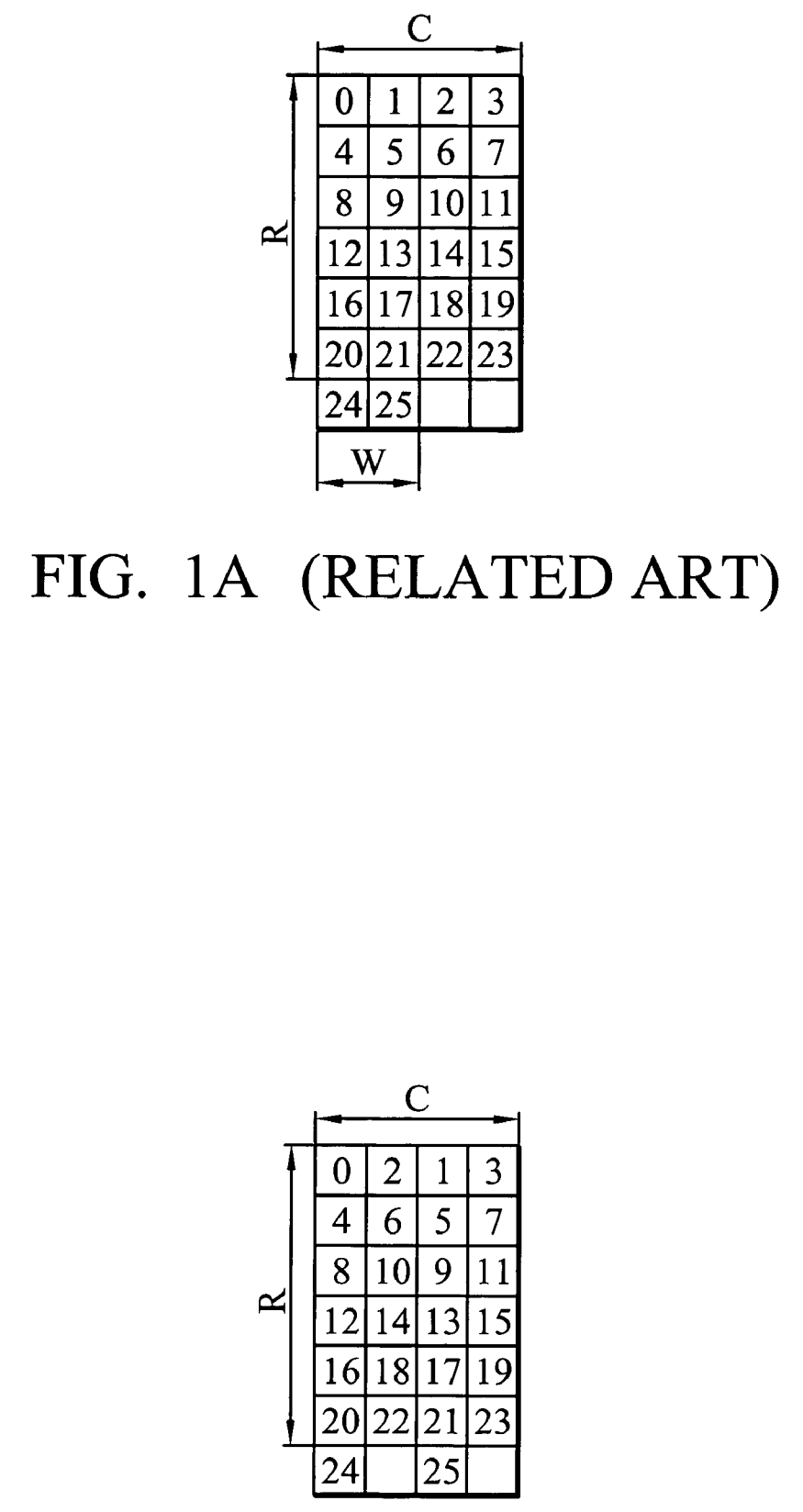
Figure 3:
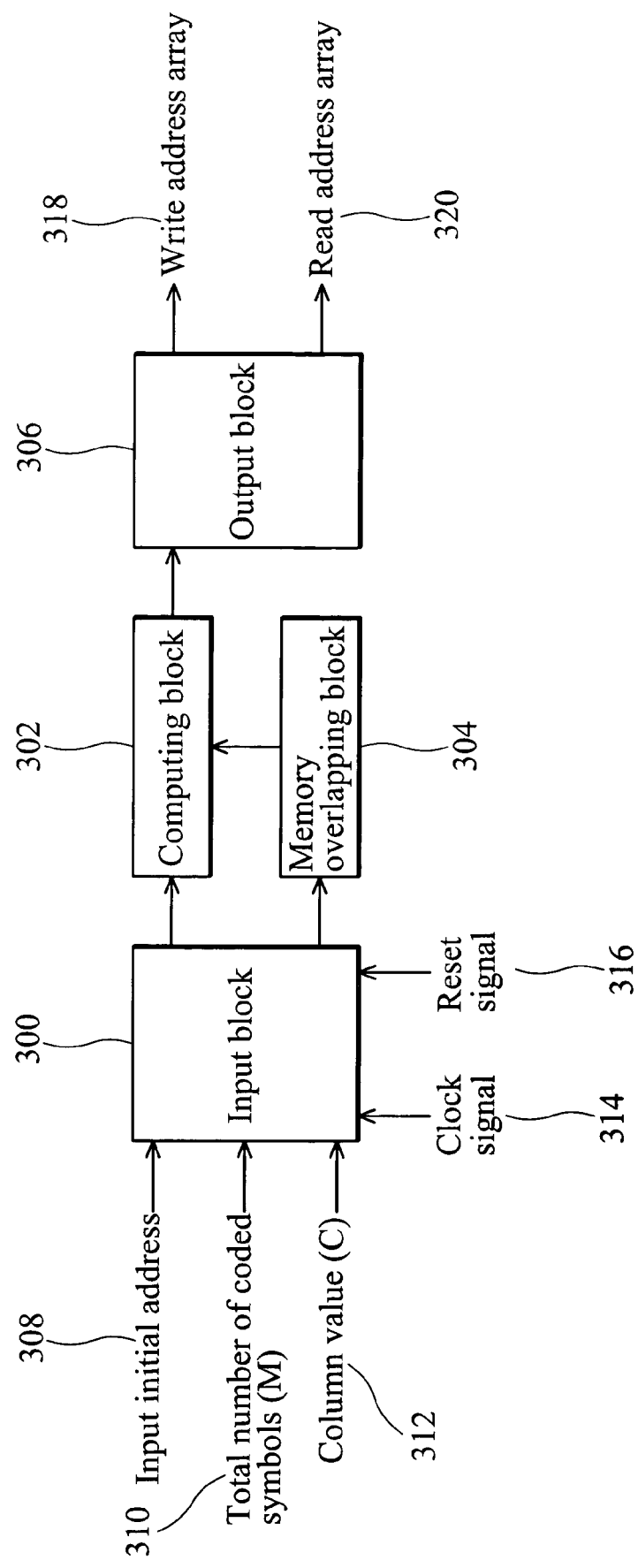
FIG. 3 is a block diagram illustrating an embodiment of the address generator.

FIGS. 1A, 1B and 2 illustrate an embodiment of a simple example of block interleaving and de-interleaving operations. The concept of block interleaving is based on M coded symbols arrayed in a matrix in C columns and R rows, and then swapping the columns according to a sequence matching table. FIGS. 1A and 1B represent a sequence of 26 coded symbols (0~25) which are filled into a matrix with 4 columns. The total number of coded symbols 26 is not a multiple of the column value 4, thus the whole number R obtained from dividing 26 by 4 is 6 (R=M/C), and the remainder W is 2 (W=M%C). As shown in FIGS. 1A and 1B, the coded symbols do not fill the matrix completely as there are W tail elements in the last row. The sequence matching table $[T_0, T_1, T_2, T_3]$ is (0, 2, 1, 3) in this example, and the new order of the coded symbols in the matrix after interleaving is shown in FIG. 1B. The sequences of the first (column 0) and the last (column 3) columns remain the same, whereas the sequences of the second (column 1) and third (column 2) columns are swapped. After column permutation, the coded symbols are output by column, so the coded symbols in the first column of the new order are output first, followed by the second column, and so on. The output sequence thus becomes {0, 4, . . . , 2, 6, . . . 1, 5, . . . 3, 7, . . . 19, 23}. Both the column value C and the permutation sequence of column (i.e. the sequence matching table) correspond in both the interleaver and de-interleaver.

The de-interleaver recovers the order of the coded symbols. The received coded symbols are first filled in the matrix by row as shown in FIG. 1B, and then the sequence of columns is rearranged according to the sequence matching table to recover the matrix shown in FIG. 1A. The coded symbols are read by row, from the first row to the last row.

After clarifying the desired effects of block interleaving and de-interleaving operations, FIG. 2 illustrates an embodiment of the interleaving and de-interleaving method. The same example comprising 26 encoded symbols (M=26) and 4 columns (C=4) is used here, and the relative row value and the remainder are 6 and 2 respectively (R=6, W=2). A total of 26+26−6=46 (M+M−R) memory cells are required to store the coded symbols during this interleaving/de-interleaving operation. The memory with 46 memory cells is divided into two blocks, each comprising 26 memory cells, read memory block 220 and write memory block 200, wherein 6 (R) memory cells from Address 20 to Address 25 overlap. The overlapping memory cells indicate that some memory cells are reusable.

As shown in FIG. 2, the four steps (Step A~Step D) describe the interleaving method. In Step A, the 26 coded symbols are stored in the read memory block 220 sequentially, the first coded symbol stored in Address 20 and the last coded symbol in Address 45. In some embodiments, the coded symbols are read out by jumping according to a predetermined pattern, and then written to the write memory block sequentially. When a coded symbol is written in the write memory block, it is immediately output without waiting for the block interleaving to be completed.

Step B describes the process of reading and writing the coded symbols related to the first corresponding value in the sequence matching table. Each corresponding value in the sequence matching table is individually selected as the reference value. When reading the coded symbols related to a reference value from the read memory block 220, the coded symbol corresponding to the reference value is read, and then jumps C memory cells to read the subsequent coded symbols until the end of the coded sequence. In this example, the first corresponding value $T_0$ is 0, the column value C is 4, and the start address of the read memory block 220 is 20. Accordingly, the first coded symbol corresponding to $T_0$ is stored in Address $T_0+20$, Address 20 in this case. The coded symbols stored in Address {$T_0+20+4$, $T_0+20+4*2$, $T_0+20+4*3$, . . . } are read thereafter, {24, 28, 32, 36, 40, 44} in this example. The coded symbols are written in the write memory block in the reading order. As shown in FIG. 2, Step B, the first 7 coded symbols read out are stored in Address 0 to 6.

The second corresponding value $T_1$ becomes the next reference value, and $T_1$ is 2 in this example, such that coded symbol 2 is read from Address $T_1+20$ (22) and the coded symbols following the same rule of jumping to read the fourth coded symbol after the previous coded symbol until the end of the coded sequence. As shown in Step C, before performing the reading and writing processes for the last corresponding value, the non-overlapping part of the write memory block 200 is filled completely. The last corresponding value $T_3$ indicates the read coded symbol 3 in Address 23, and the overlapping memory cells become empty after the coded symbol 3 is read out. This ensures that all the data in the overlapping memory is read out before rewriting. Step D illustrates successful block interleaving as all the coded symbols are stored in the write memory block 200 in the desired order according to the sequence matching table.

As shown in the matrix of FIG. 1A, however, it is possible to have either 6 (R) or 7 (R+1) coded symbols in a column. In order to consider the tail elements in the $(R+1)^{st}$ row, determination of the existence of a coded symbol in the $(R+1)^{st}$ row is necessary for each corresponding value of the sequence matching table. A simple determination method is to compare each of the corresponding values with the remainder W, and if the corresponding value is less than the remainder, the $(R+1)^{st}$ coded symbol must be read, otherwise each corresponding value only corresponds to R coded symbols.

For example, since the second corresponding value 2 is not less than the remainder 2 in this case, it only reads 6 coded symbols, whereas the third corresponding value 1 is less than the remainder 2, so 7 coded symbols are read out. The maximum number of overlapping memory cells is the row value (R) calculated by dividing the total number of coded symbols by the column value. The initial output address (Address 0), the starting address of the write memory block, is calculated by subtracting the total number of coded symbols (M) from the initial input address (Address 20), then adding the row value (R).

Similarly, the coded symbols for de-interleaving are stored in the read memory block 220, and are read out sequentially from the initial input address (Address 20). The writing operation for the de-interleaver is similar to the reading operation for the interleaver. Each corresponding value of the sequence matching table is individually selected as the reference value. The de-interleaver writes the coded symbols corresponding to each corresponding value into the write memory block 200 by jumping every R address. For example, if the first corresponding value is 0, the initial output address (the starting address of the write memory block) is also 0. There are seven corresponding coded symbols because the first corresponding value ($T_0$) 0 is less than the remainder (W) 2. The first seven coded symbols are therefore stored in Address 0 ($T_0$), 4 ($T_0+R$), 8 ($T_0+2R$), 12 ($T_0+3R$), 16 ($T_0+4R$), 20 ($T_0+5R$), 24 ($T_0+6R$). The second corresponding value ($T_1$) 2 is not less than the remainder, thus the next six coded symbols are stored in Address 2 ($T_1$), 6 ($T_0+R$), 10 ($T_0+2R$), 14 ($T_0+3R$), 18 ($T_0+4R$), 22 ($T_0+5R$).

Subsequent to the reading and writing operations for all the corresponding values in the sequence matching table, the write memory block stores the coded symbols in the original sequence {0, 1, 2, . . . , 24, 25}.

An address generator performing the above interleaving and de-interleaving operations is also provided. FIG. 3 is a block diagram of the address generator in the present embodiment. An input block 300 of the address generator receives parameters comprising initial input address 308, total number of coded symbols (M) 310, column value (C) 312, clock signal 314, and reset signal 316. The input block 300 divides the total number of coded symbols 310 by the column value 312 to obtain a whole number R (M/C) and a remainder W (M%C). A memory overlap block 304 receives an initial input address 308, total number of coded symbols 310, and the remainder W for calculating an initial output address.

A computing block 302 in the address generator comprises two loops and a sequence matching table, and the computing block 302 calculates an input address index and an output address index for each coded symbol according to the corresponding value of the sequence matching table. The initial input address 308 acts as a reference to the input address index of each coded symbol, and a corresponding read address is obtained by adding the initial input address 308 and the input address index. Similarly, the initial output address acts as the reference to the output address index of each coded symbol, and a corresponding write address is the sum of the initial output address and the output address index. The computing block 302 further comprises an offset block for address correction. The offset block detects if the corresponding value is less than the remainder (W), in order to determine whether it requires reading of an extra coded symbol, and the offset block accumulates the offset to ensure the tail elements are correctly considered in the calculation. An output block 306 outputs the calculated addresses in a read address array 320 and a write address array 318.

Figure 4:
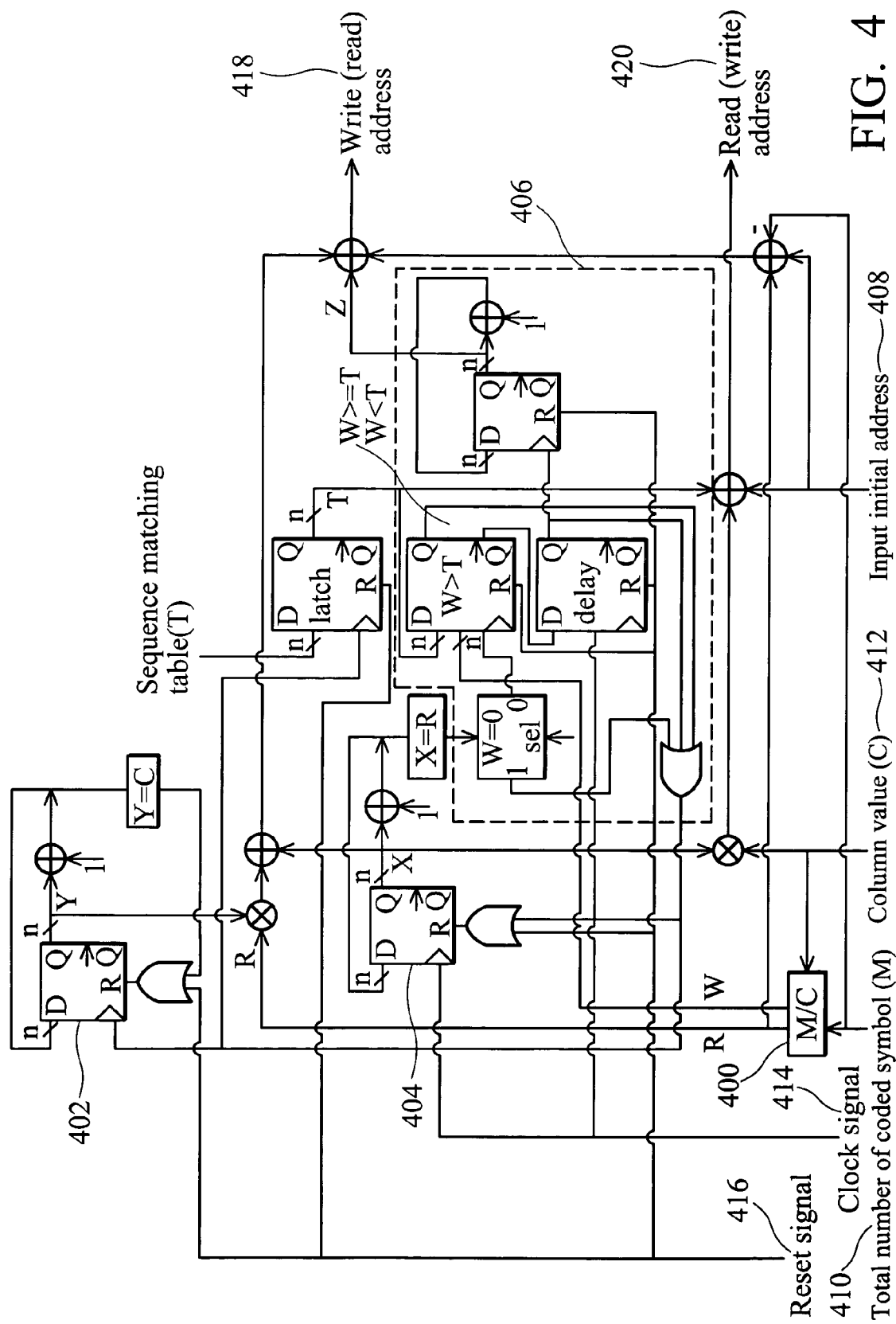
FIG. 4 is a logic circuit diagram illustrating an embodiment of the address generator.

FIG. 4 illustrates an example of the logic circuit diagram for realizing the address generator shown in FIG. 3. Calculation block 400 divides total number of coded number 410 by column value 412 to obtain a whole number R and a remainder W. Loops 402 and 404 combine the offset block 406 to compute read address 420 and write address 418 for each coded symbol. A reset signal 416 sets all logic units such as registers, delay flip-flop (d flip-flop), and loops at the start of every interleaving/de-interleaving operation.

In some embodiments, the block interleaving/de-interleaving method can be implemented using a simple program, and the address generator can also be constructed according to the program. An example of such program is shown below, where C is the predetermined column value, R is the whole number obtained from dividing the total number of coded symbols by the column value C, and W is the remainder of the division. Z is an offsetting accumulation of address for correcting the output/input address index, and T_table is the sequence matching table comprising C corresponding values.

At the transmitter, a possible program performing the block interleaving method is represented below:

```
Z=0;
for(y=0;y<C;y++)
{
    T=T_table[y];
    for(x=0;x<R;x++)
```

-continued

```
    {
        out[y*R+x+Z]=in[x*C+T];
    }
    if(T<W)
    {
        Z++;
        out[y*R+x+Z]=in[x*C+T];
    }
}
```

At the receiver, a possible program performing the block de-interleaving method is represented below:

```
Z=0;
for(y=0;y<C;y++)
{
    T=T_table[y];
    for(x=0;x<R;x++)
    {
        out[x*C+T]=in[y*R+x+Z];
    }
    if(T<W)
    {
        Z++;
        out[x*C+T]=in[y*R+x+Z];
    }
}
```

Finally, while the invention has been described by way of example and in terms of the above, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A block interleaving encoding method for generating addresses, comprising the steps of:
    providing M coded symbols to perform block interleaving on a memory, the memory comprises a write memory block and a read memory block, the write memory block having memory cells starting with an initial output address, and the read memory block has memory cells starting with an initial input address;
    storing the M coded symbols in the M memory cells following the initial input address successively;
    determining a column value (C) for segmenting the M coded symbols;
    determining a sequence matching table comprising C corresponding values for appointing the interleaving order;
    obtaining one of the C corresponding values in the sequence matching table as a reference value successively;
    reading out the coded symbols from the read memory block starting from the reference value with a fixed spacing C;
    writing the read coded symbols to the corresponding memory cells of the write memory block successively; and
    repeating the above reading and writing processes until all the C corresponding values have been selected.

2. The block interleaving encoding method according to claim 1, further comprising dividing the total number of coded symbols (M) by the column value (C) to obtain a whole number (R) and a remainder (W).

3. The block interleaving encoding method according to claim 2, further comprising segmenting the M coded symbols into R blocks with W remainder coded symbols, wherein each block includes C coded symbols and a $(R+1)^{st}$ block includes W coded symbols.

4. The block interleaving encoding method according to claim 3, further comprising reading a coded symbol in the $(R+1)^{st}$ block corresponding to the reference value if the reference value is less than the remainder W.

5. The block interleaving encoding method according to claim 2, wherein the initial output address is computed by subtracting the initial input address from the total number of coded symbols (M), and adding the whole number (R) obtained by dividing M with column value C.

6. The block interleaving encoding method according to claim 2, wherein the read memory block overlaps the write memory block by R memory cells from the initial input address.

7. The block interleaving encoding method according to claim 1, wherein the sequence matching table and the column value (C) correspond in both interleaving and de-interleaving.

8. A block de-interleaving encoding method for generating addresses, comprising the steps of:
    providing M coded symbols to perform block de-interleaving on a memory, wherein the memory comprises a write memory block and a read memory block, the write memory block has memory cells starting with an initial output address, and the read memory block has memory cells starting with an initial input address;
    storing the M coded symbols in the M memory cells following the initial input address successively;
    determining a column value (C) for segmenting the M coded symbols;
    determining a sequence matching table comprising C corresponding values for appointing the interleaving order;
    segmenting the M coded symbols into C blocks, wherein each block corresponds to each corresponding value of the sequence matching table;
    reading out the coded symbols of the read memory block sequentially; and
    writing the coded symbols obtained from each block in the order according to the sequence matching table until all coded symbols are written into the write memory block.

9. The block de-interleaving encoding method according to claim 8, further comprising dividing the total number of coded symbols (M) by the column value (C) to obtain a whole number (R) and a remainder (W).

10. The block de-interleaving encoding method according to claim 9, dividing the M coded symbol into C blocks corresponding to the C corresponding values further comprising comparing the corresponding value of each block with the remainder (W) to determine whether there are R or R+1 coded symbols in the block, and if the corresponding value of the block is less than the remainder (W), the block has R+1 coded symbols, otherwise the block has R coded symbols.

11. The block de-interleaving encoding method according to claim 9, wherein the memory cells of the write memory block overlap with the memory cells of the read memory block by R memory cells.

12. The block de-interleaving encoding method according to claim 9, wherein the initial output address is computed by subtracting the initial input address from the total number of coded symbols (M), and adding the whole number (R) obtained by dividing M with column value C.

13. An address generator for block interleaving and de-interleaving performing interleaving and de-interleaving on M coded symbols, comprising:

an input block, receiving input parameters comprising an initial input address, a total number of coded symbols (M), a column value (C), a clock signal, and a reset signal;

a memory overlap block, coupling to the input block and computing an initial output address according to the input parameters;

a computing block, coupling to the input block and the memory overlap block and calculating read and write addresses for each of the M coded symbols; and an output block, coupling to the computing block and outputting a read address array and a write address array;

wherein the computing block computes an input address index and an output address index for each of the M coded symbols in two loops, combined with the initial input address, the initial output address, and a sequence matching table corresponding to both sides, performing interleaving and de-interleaving to compute the read and write addresses for each of the M coded symbols.

14. The address generator for performing interleaving and de-interleaving according to claim 13, wherein the computing block further comprises an address offset block for offsetting the output address index according to a remainder (W) calculated by dividing the total number of the coded symbols (M) by the column value (C).

15. The address generator for performing interleaving and de-interleaving according to claim 13, wherein the computing block computes the addresses for the M coded symbols using a two-dimensional concept of arranging the addresses in a matrix of C columns and R rows.

16. The address generator for performing interleaving and de-interleaving according to claim 13, wherein the read address array comprises M addresses corresponding to M addresses of a read memory block.

17. The address generator for performing interleaving and de-interleaving according to claim 13, wherein the write address array comprises M addresses corresponding to M addresses of a write memory block.

18. The address generator for performing interleaving and de-interleaving according to claim 17, wherein the read address array overlaps the write address array by R addresses.

* * * * *